United States Patent
Kida et al.

(10) Patent No.: US 7,224,200 B2
(45) Date of Patent: May 29, 2007

(54) LEVEL SHIFT CIRCUIT, DISPLAY APPARATUS, AND PORTABLE TERMINAL

(75) Inventors: Yoshitoshi Kida, Kanagawa (JP); Yoshiharu Nakajima, Kanagawa (JP); Hiroaki Ichikawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 7 days.

(21) Appl. No.: 10/484,953

(22) PCT Filed: May 26, 2003

(86) PCT No.: PCT/JP03/06523

§ 371 (c)(1),
(2), (4) Date: Jan. 27, 2004

(87) PCT Pub. No.: WO03/103144

PCT Pub. Date: Dec. 11, 2003

(65) Prior Publication Data

US 2004/0207448 A1    Oct. 21, 2004

(30) Foreign Application Priority Data

May 30, 2002    (JP)    ............................. 2002-157054

(51) Int. Cl.
*H03L 5/00*    (2006.01)
(52) U.S. Cl. ........................... 327/333; 326/60; 326/62
(58) Field of Classification Search .................. 327/333
See application file for complete search history.

(56) References Cited

U.S. PATENT DOCUMENTS

| | | | | |
|---|---|---|---|---|
| 5,136,190 A | * | 8/1992 | Chern et al. .................. | 326/81 |
| 5,204,557 A | * | 4/1993 | Nguyen ........................ | 326/81 |
| 5,237,212 A | * | 8/1993 | Maekawa .................... | 327/333 |
| 5,457,420 A | * | 10/1995 | Asada ......................... | 327/437 |
| 5,537,059 A | * | 7/1996 | Asahina ....................... | 326/81 |
| 5,559,464 A | * | 9/1996 | Orii et al. .................... | 327/333 |
| 5,666,070 A | * | 9/1997 | Merritt et al. ................ | 326/81 |
| 5,818,257 A | * | 10/1998 | Villa ............................. | 326/81 |
| 6,011,421 A | | 1/2000 | Jung ........................... | 327/333 |

(Continued)

FOREIGN PATENT DOCUMENTS

JP    4-242317 A    8/1992

(Continued)

*Primary Examiner*—Tuan T. Lam
*Assistant Examiner*—Hiep Nguyen
(74) *Attorney, Agent, or Firm*—Robert J. Depke; Rockey, Depke, Lyons & Kitzinger LLC.

(57) ABSTRACT

In the structure in which an input signal IN and a reverse-phase signal XIN thereof are externally input, an external IC is required for generating the reverse-phase signal XIN, and the number of required input signal terminals is two.

A level shift circuit formed on an insulating substrate, such as a glass substrate, using transistors with large characteristic variations, for example, TFTs with high thresholds Vth, includes a complementary generator unit (11) driven by a first power supply (VCC) having an amplitude voltage equal to the amplitude voltage of a signal externally input from the substrate to generate complementary signals from a single-phase input signal IN. The complementary signals generated by the complementary generator unit (11) are level-shifted by a level shift unit (14). Therefore, it is no longer necessary to externally input the reverse-phase signal XIN.

2 Claims, 8 Drawing Sheets

U.S. PATENT DOCUMENTS

| | | | |
|---|---|---|---|
| 6,064,229 A | 5/2000 | Morris | 326/81 |
| 6,222,384 B1 | 4/2001 | Kim | 326/68 |
| 6,333,662 B1 | 12/2001 | Umezawa et al. | 327/333 |
| 6,373,460 B1* | 4/2002 | Kubota et al. | 345/100 |
| 6,445,210 B2 | 9/2002 | Nojiri | 326/68 |
| 6,445,622 B1 | 9/2002 | Hirano | 365/189.11 |
| 6,542,144 B2 | 4/2003 | Kogure et al. | 345/98 |
| 6,590,570 B1* | 7/2003 | Maki | 345/204 |
| 6,593,920 B2* | 7/2003 | Okumura et al. | 345/204 |
| 6,777,981 B2 | 8/2004 | Kobayashi | 326/81 |
| 6,777,997 B2 | 8/2004 | Tahara et al. | 327/333 |
| 6,791,392 B2 | 9/2004 | Maejima et al. | 327/333 |
| 6,801,181 B2 | 10/2004 | Matsumoto et al. | 345/98 |
| 6,867,760 B2* | 3/2005 | Yanagi et al. | 345/99 |
| 6,909,417 B2* | 6/2005 | Washio et al. | 345/98 |
| 7,046,067 B2* | 5/2006 | Chung | 327/333 |
| 2001/0013795 A1 | 8/2001 | Nojiri | 326/81 |
| 2004/0061525 A1* | 4/2004 | Tamaki | 326/81 |
| 2005/0146370 A1* | 7/2005 | Hsu et al. | 327/333 |
| 2005/0270080 A1* | 12/2005 | Kida et al. | 327/333 |

FOREIGN PATENT DOCUMENTS

| | | |
|---|---|---|
| JP | 6-235740 A | 9/1993 |
| JP | 7-231253 A | 8/1995 |
| JP | 10-28049 A | 1/1998 |
| JP | 10-135817 A | 5/1998 |
| JP | 10-209284 A | 8/1998 |
| JP | 11-27137 A | 1/1999 |
| JP | 2001-57518 A | 2/2001 |
| JP | 2001-75540 A | 3/2001 |
| JP | 2001-339290 A | 12/2001 |
| JP | 2002-40997 A | 2/2002 |
| JP | 2002-140052 A | 5/2002 |

* cited by examiner

LEVEL SHIFT CIRCUIT, DISPLAY APPARATUS, AND PORTABLE TERMINAL

This application claims priority to Japanese Patent Application Number JP2002-157054, filed May 30, 2002 which is incorporated herein by reference.

TECHNICAL FIELD

The present invention relates to a level shift circuit, a display apparatus, and a portable terminal. Particularly, the present invention relates to a level shift circuit formed on an insulating substrate using transistors with large characteristic variations, a display apparatus using the level shift circuit as a peripheral driving circuit, and a portable terminal including the display apparatus as a screen display unit.

BACKGROUND ART

An example structure of a level shift circuit of the related art is shown in FIG. 9. The level shift circuit in this example level-shifts (level-converts) an input signal IN with a low voltage amplitude of, for example, 3.3 V to a signal with a high voltage amplitude of, for example, 6.5 V. As is apparent from FIG. 9, the level shift circuit includes two bias shift units 101 and 102, a level shift unit 103, and an output unit 104.

If the level shift circuit of this type is formed of transistors with large characteristic variations, for example, TFTs (Thin Film Transistors), in addition to the input signal IN, a reverse-phase signal XIN of the input signal IN must be input in order to reliably activate the circuit. Alternately, in place of the reverse-phase signal XIN, a reference potential Ref having an intermediate level of the amplitude of the input signal IN must be input. The input signals IN and XIN (or Ref) must be input directly to a source of the input stage of the level shift unit 103.

As described above, in the structure in which, in addition to the input signal IN, the reverse-phase signal XIN is externally input, an external IC is required for generating the reverse-phase signal XIN based on the input signal IN, and the number of input signal terminals required for the level shift circuit is two. On the other hand, in the structure in which the reference potential Ref is input, an external Ref power supply is required.

If the externally input signals IN and XIN (or Ref) are input directly to the source of the input stage of the level shift unit 103, a current flows in an external input terminal, thus causing overcurrent into the external IC when the power supply is turned on or the like. This may induce latchup on the external IC.

The present invention has been made in view of the foregoing problems, and it is an object of the present invention to provide a level shift circuit which can reliably level-shift a single-phase input signal when it is formed of transistors with large characteristic variations, a display apparatus using the level shift circuit, and a portable terminal including the display apparatus as a screen display unit.

DISCLOSURE OF INVENTION

A level shift circuit of the present invention is formed on an insulating substrate, and includes a complementary generator unit driven by a first power supply having an amplitude voltage equal to an amplitude voltage of a signal input from the outside of the substrate for generating a complementary signal from the single-phase input signal, and a level shift unit driven by a second power supply having a higher voltage than the first power supply for shifting the level of the complementary signal. The level shift circuit is used for a display apparatus having a level shift circuit formed on the same transparent insulating substrate on which a display unit is formed for shifting the level of an input signal from the outside of the substrate so as to drive the display unit, and is used as this level shift circuit. The display apparatus using such a level shift circuit is disposed on a portable terminal, such as a PDA (Personal Digital Assistants) or a cellular phone, as a screen display unit thereof.

A circuit formed on an insulating substrate, such as a glass substrate, using transistors with large characteristic variations, for example, TFTs, exhibits lower TFT characteristics than that formed on a silicon substrate. Thus, a level shift circuit is required for shifting the level of an input signal to a high voltage amplitude. In a case where the level shift circuit is formed on the insulating substrate, when a single-phase signal is input from the outside of the substrate to the level shift circuit, a complementary generator unit of the level shift circuit formed on the substrate a generates complementary signal from the single-phase signal, and supplies it to a level shift unit. The level shift unit level-shifts the complementary signal from low voltage amplitude to high voltage amplitude.

BEST MODE FOR CARRYING OUT THE INVENTION

Embodiments of the present invention are described hereinbelow in detail with reference to the drawings.

[First Embodiment]

Figure 1:
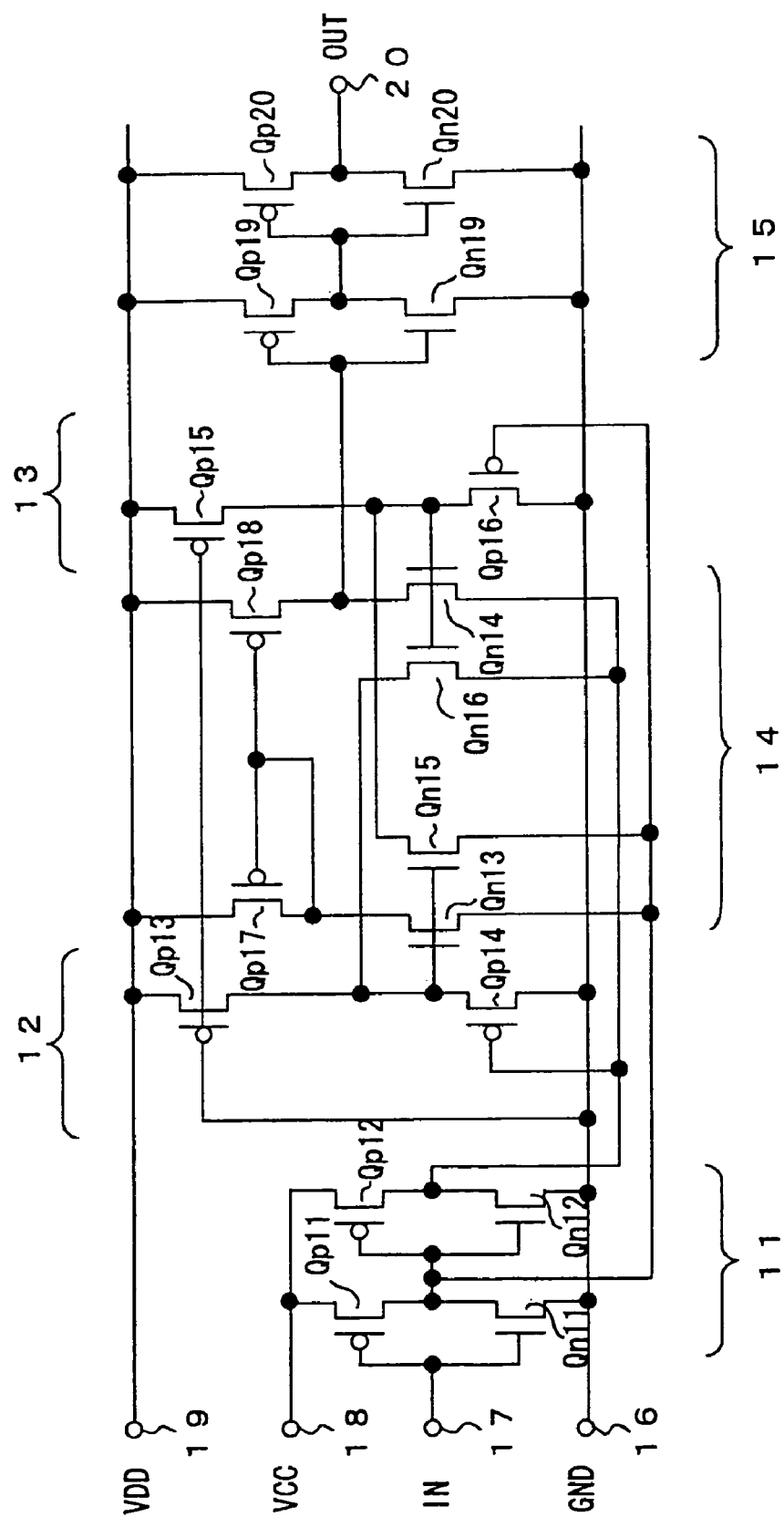
FIG. 1 is a circuit diagram showing an example structure of a level shift circuit according to a first embodiment of the present invention.

FIG. 1 is a circuit diagram showing an example structure of a level shift circuit according to a first embodiment of the present invention. It is assumed that the level shift circuit according to this embodiment is formed on an insulating substrate, such as a glass substrate, using transistors with large characteristic variations, for example, TFTs with high thresholds Vth. As is apparent from FIG. 1, the level shift circuit according to this embodiment includes a complementary generator unit 11, two bias shift units 12 and 13, a level shift unit 14, and an output unit 15. These units are formed on the insulating substrate using TFTs.

The level shift circuit has a ground (GND) terminal 16, a circuit input terminal 17, two power supply terminals 18 and 19, and a circuit output terminal 20. A first power supply voltage VCC equal to the amplitude voltage (for example, 3.3 V) of a signal input from the outside of the substrate is applied to the power supply terminal 18. A second power supply voltage VDD (for example, 6.5 V) higher than the first power supply voltage VCC is applied to the power supply terminal 19.

The complementary generator unit 11 is formed of two cascaded inverters, for example, a first CMOS inverter having a PMOS transistor Qp11 and an NMOS transistor Qn11 connected in series between a VCC power-supply line (hereinafter referred to as a VCC line) and a GND line, each having a gate connected with the circuit input terminal 17, and a second CMOS inverter having a PMOS transistor Qp12 and an NMOS transistor Qn12 connected in series between the VCC line and the GND line, each having a gate connected with the common drain node of the MOS transistors Qp11 and Qn11.

In the complementary generator unit 11, when an input signal IN is input to the circuit input terminal 17, a reverse-phase signal XIN of the input signal IN is output from the output end of the first CMOS inverter, i.e., the common drain node of the MOS transistors Qp11 and Qn11, and a signal IN that is in-phase with the input signal IN is output from the output end of the second CMOS inverter, i.e., the common drain node of the MOS transistors Qp12 and Qn12. In other words, the complementary generator unit 11 is driven by the first power supply voltage VCC, which is equal to the amplitude voltage of a signal input from the outside of the substrate, to generate the complementary signals IN and XIN from the input signal IN.

The bias shift unit 12 is formed of PMOS transistors Qp13 and Qp14 connected in series between a VDD power-supply line (hereinafter referred to as a VDD line) and the GND line. A gate of the MOS transistor Qp13 is connected with the GND line, and a gate of the MOS transistor Qp14 is connected with a signal line (hereinafter referred to as an IN line) for carrying the in-phase signal of the input signal IN. The bias shift unit 12 shifts a DC bias of the in-phase signal IN.

The bias shift unit 13 is formed of PMOS transistors Qp15 and Qp16 connected in series between the VDD line and the GND line. A gate of the MOS transistor Qp15 is connected with the GND line, and a gate of the MOS transistor Qp16 is connected with a signal line (hereinafter referred to as an XIN line) for carrying the reverse-phase signal XIN of the input signal IN. The bias shift unit 13 shifts a DC bias of the reverse-phase signal XIN.

The level shift unit 14 includes two PMOS transistors Qp17 and Qp18, and four NMOS transistors Qn13 through Qn16. The two PMOS transistors Qp17 and Qp18 have sources connected with the VDD line and gates commonly connected, and the gate and drain of the MOS transistor Qp17 are connected, thereby forming a current mirror circuit.

The NMOS transistor Qn13 has a drain connected with the drain of the PMOS transistor Qp17, a gate connected with the output end of the bias shift unit 12, i.e., the drain-source common node of the PMOS transistors Qp13 and Qp14, and a source connected with the XIN line. The NMOS transistor Qn14 has a drain connected with a drain of the PMOS transistor Qp18, a gate connected with the output end of the bias shift unit 13, i.e., the drain-source common node of the PMOS transistors Qp15 and Qp16, and a source connected with the IN line.

The NMOS transistor Qn15 has a drain connected with the output end of the bias shift unit 13, a gate connected with the output end of the bias shift unit 12, and a source connected with the XIN line. The NMOS transistor Qn16 has a drain connected with the output end of the bias shift unit 12, a gate connected with the output end of the bias shift unit 13, and a source connected with the IN line. Therefore, the level shift unit 14 is formed of a source-input-type current mirror amp, that is, the reverse-phase signal XIN and the in-phase signal IN are input to the sources of the NMOS transistors Qn13 and Qn14 at the input stage, respectively.

The output unit 15 is formed of a first CMOS inverter having a PMOS transistor Qp19 and an NMOS transistor Qn19 connected in series between the VDD power-supply line and the GND line, each having a gate connected with the output end of the level shift unit 14, i.e., the common drain node of the MOS transistors Qp18 and Qn14, and a second CMOS inverter having a PMOS transistor Qp20 and an NMOS transistor Qn20 connected in series between the VDD line and the GND line, each having a gate connected with the common drain node of the MOS transistors Qp19 and Qn19.

Figure 2:
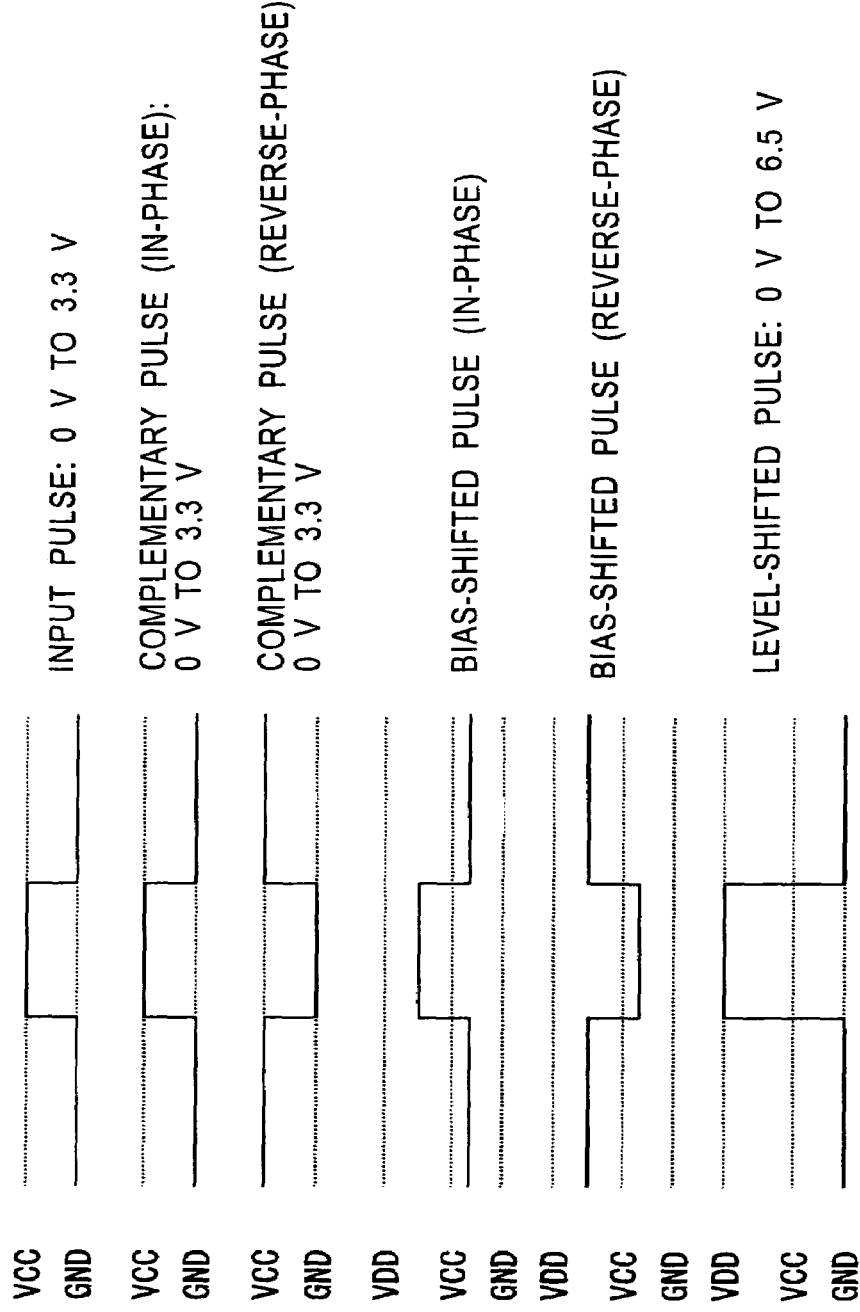
FIG. 2 is a timing chart showing the circuit operation of the level shift circuit according to the first embodiment.

The circuit operation of the level shift circuit according to the first embodiment having the above-described structure is described hereinbelow with reference to the timing chart shown in FIG. 2. In the following description, the input signal IN is a pulse signal, by way of example.

When a single-phase input pulse with 0 to 3.3 V amplitude is input via the circuit input terminal 17, the complementary generator unit 11 generates complementary (in-phase and reverse-phase) pulses of 0 V to 3.3 V from this input pulse. The generated complementary pulses, whose DC biases are shifted by the bias shift units 12 and 13 by certain voltages, are input to the gates of the NMOS transistors Qn13 and Qn14 of the level shift unit 14.

The complementary pulses, which have not been bias-shifted by the bias shift units 12 and 13, are crossed and input to the sources of the NMOS transistors Qn13 and Qn14. Specifically, the reverse-phase pulse, which has not been bias-shifted, is input to the source of the NMOS transistor Qn13 whose gate the bias-shifted in-phase pulse is input to. The in-phase pulse, which has not been bias-shifted, is input to the source of the NMOS transistor Qn14 whose gate the bias-shifted reverse-phase pulse is input to.

Accordingly, complementary pulses, which have not been bias-shifted, are crossed and input to the sources of the NMOS transistors Qn13 and Qn14 forming a current mirror amp, thus allowing rapid level shifting to a high voltage amplitude (in this example, 6.5 V) if the level shift circuit is formed of TFTs with large characteristic variations and high thresholds Vth. The level shift unit 14 has a structure in which the complementary pulses are input directly to the sources; however, the D.C. currents flowing from the sources are supplied from the inverters of the complementary generator 11, resulting in no D.C. current flowing in an external clock line.

In the level shift unit 14 having such a current mirror amp, the complementary pulses with 0 to 3.3 V amplitude are level-shifted to pulses with 0 to 6.5 V amplitude, and are then output as a single-phase output pulse OUT that is in-phase with the input pulse IN from the circuit output terminal 20 via the output unit 15.

As described above, a level shift circuit formed on an insulating substrate, such as a glass substrate, using transistors with large characteristic variations, for example, TFTs with high thresholds Vth, is provided with the complementary generator unit 11 driven by a first power supply (VCC) having an amplitude voltage equal to the amplitude voltage of a signal input from the outside of the substrate to generate complementary signals from a single-phase input signal IN, and it is therefore no longer necessary to externally input a reverse-phase signal XIN. Thus, no external IC is required for generating the reverse-phase signal XIN based on the input signal IN, and one terminal of the level shift circuit can be eliminated.

Moreover, the input signal IN is not input directly from the outside to the sources of the source-input level shift unit 14, but is received by the inverters of the complementary generator unit 11 so as to convert the signal into complementary signals, which are then input thereto. This results in no D.C. current flowing in the input terminal 17, and eliminates the danger of flowing overcurrent into an external signal line, which carries the input signal IN, when the power supply is turned on or the like.

Since the level shift circuit according to this embodiment uses the level shift unit 14 of the source input type, some circuit delay can occur. However, this level shift circuit is able to level-shift the input signal IN and output it as the output signal OUT in real time, thus achieving very high operation speed. This is suitable for level-shifting high-operation-frequency clock signals.

In a case where a circuit is formed on a silicon substrate using TFTs, a signal of a low voltage amplitude (in this example, 0 to 3.3 V) is sufficient to drive the circuit. Therefore, a level shift circuit for level-shifting the input signal to a high voltage amplitude is not necessary. On the other hand, a circuit formed on an insulating substrate, such as a glass substrate, using TFTs exhibits lower TFT characteristics than that formed on a silicon substrate. Such a circuit must therefore-include a level shift circuit for level-shifting the input signal to a high voltage amplitude in order to correctly activate the circuit. The level shift circuit according to this embodiment is suitable as such a level shift circuit formed on an insulating substrate using TFTs.

[Second Embodiment]

Figure 3:
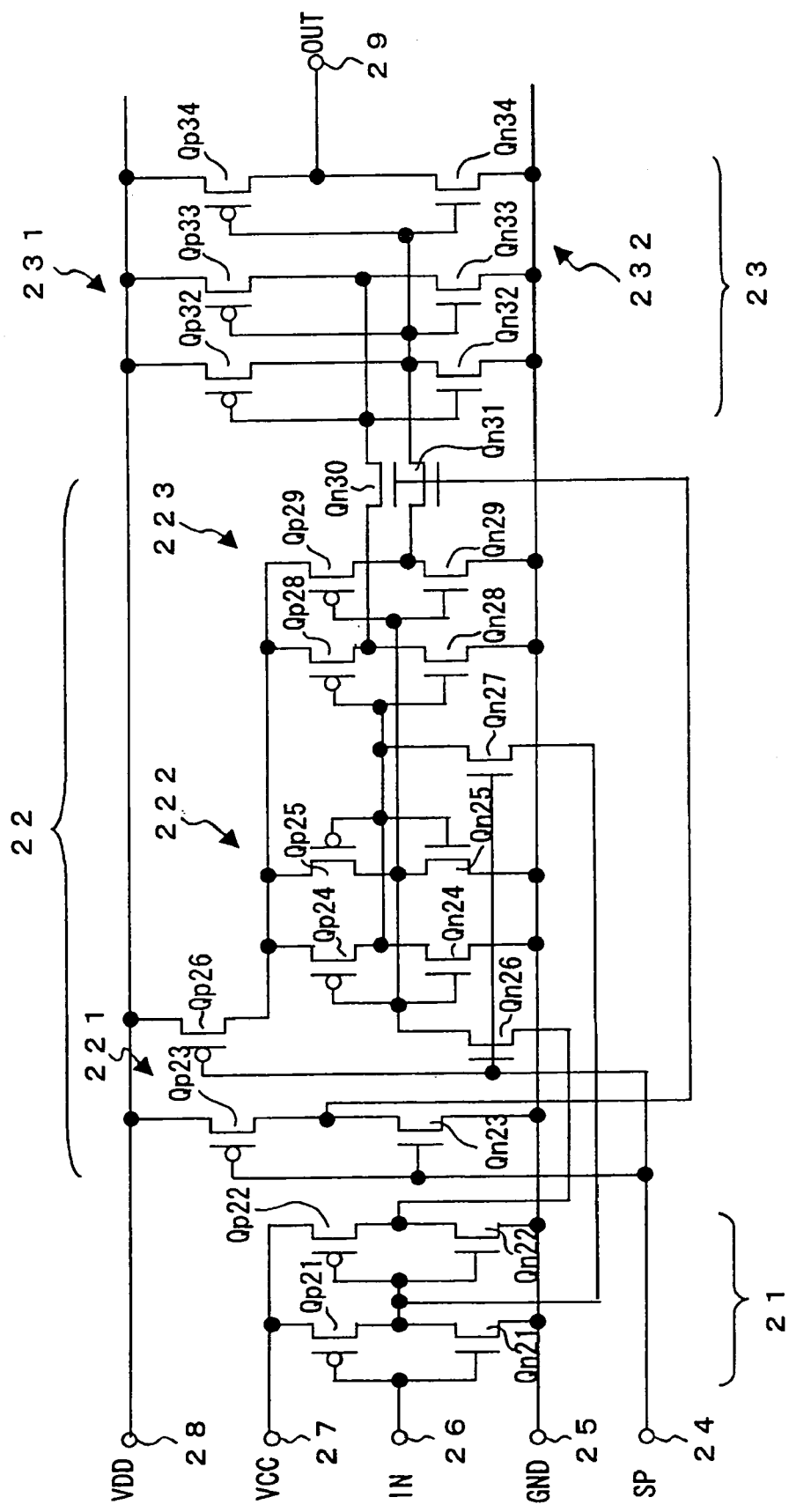
FIG. 3 is a circuit diagram showing an example structure of a level shift circuit according to a second embodiment of the present invention.

FIG. 3 is a circuit diagram showing an example structure of a level shift circuit according to a second embodiment of the present invention. It is assumed that the level shift circuit according to this embodiment is formed on an insulating substrate, such as a glass substrate, using transistors with large characteristic variations, for example, TFTs with high thresholds Vth, like the level shift circuit according to the first embodiment. As is apparent from FIG. 3, the level shift circuit according to this embodiment includes a complementary generator unit 21, a first latch unit 22, and a second latch unit 23. These units are formed on the insulating substrate using TFTs.

The level shift circuit has a control terminal 24, a ground (GND) terminal 25, a circuit input terminal 26, two power supply terminals 27 and 28, and a circuit output terminal 29. A sampling pulse SP is input from the outside of the substrate to the control terminal 24. A first power supply voltage VCC equal to the amplitude voltage (for example, 3.3 V) of a signal input from the outside of the substrate is applied to the power supply terminal 27. A second power supply voltage VDD (for example, 6.5 V) higher than the first power supply voltage VCC is applied to the power supply terminal 28.

The complementary generator unit 21 is formed of two cascaded inverters, for example, a first CMOS inverter having a PMOS transistor Qp21 and an NMOS transistor Qn21 connected in series between a VCC line and a GND line, each having a gate connected with the circuit input terminal 26, and a second CMOS inverter having a PMOS transistor Qp22 and an NMOS transistor Qn22 connected in series between the VCC line and the GND line, each having a gate connected with the common drain node of the MOS transistors Qp21 and Qn21.

In the complementary generator unit 21, when an input signal IN is input to the circuit input terminal 26, a reverse-phase signal XIN of the input signal IN is output from the output end of the first CMOS inverter, i.e., the common drain node of the MOS transistors Qp21 and Qn21, and a signal IN that is in-phase with the input signal IN is output from the output end of the second CMOS inverter, i.e., the common drain node of the MOS transistors Qp22 and Qn22. In other words, the complementary generator unit 21 is driven by the first power supply voltage VCC, which is equal to the amplitude voltage of an signal input from the outside of the substrate, to generate the complementary signals IN and XIN from the input signal IN.

The first latch unit 22 is formed of a CMOS inverter 221, a CMOS latch cell 222, and an inverter circuit 223. The CMOS inverter 221 is formed of a PMOS transistor Qp23 and an NMOS transistor Qn23 connected in series between a VDD line and the GND line, gates thereof being commonly connected. The CMOS inverter 221 inverts the sampling pulse SP with 0 to 3.3 V amplitude input via the control terminal 24, and also level-shifts it to a sampling pulse SP with 6.5 to 0 V amplitude.

The CMOS latch cell 222 includes a first CMOS inverter having a PMOS transistor Qp24 and an NMOS transistor Qn24 connected in series, gates thereof being commonly connected, and a second CMOS inverter having a PMOS transistor Qp25 and an NMOS transistor Qn25 connected in series, gates thereof being commonly connected. The input and output ends of these CMOS inverters are cross-connected.

More specifically, the input end of the first CMOS inverter, i.e., the common gate node of the MOS transistors Qp24 and Qn24, is connected with the output end of the second CMOS inverter, i.e., the common drain node of the MOS transistors Qp25 and Qn25, and the input end of the second CMOS inverter, i.e., the common gate node of the MOS transistors Qp25 and Qn25 is connected with the output end of the first CMOS inverter, i.e., the common drain node of the MOS transistors Qp24 and Qn24.

A PMOS transistor Qp26 is connected between the power-supply side of the CMOS latch cell 222 and the VDD line. The PMOS transistor Qp26 is turned on for a low-level period of the sampling pulse SP input via the control terminal 24 to supply the power supply voltage VDD to the CMOS latch cell 222, and is turned off for a high-level period of the sampling pulse SP to interrupt the supply of the power supply voltage VDD to the CMOS latch cell 222. Therefore, the latch unit 22 of the sampling latch type is constructed as a level shift unit.

An NMOS transistor Qn26 is connected between the input end of the first CMOS inverter of the CMOS latch cell 222 and the output end of the second CMOS inverter of the complementary generator unit 21, and an NMOS transistor Qn27 is connected between the input end of the second CMOS inverter of the CMOS latch cell 222 and the output end of the first CMOS inverter of the complementary generator unit 21. The NMOS transistors Qn26 and Qn27 are turned on for the high-level period of the sampling pulse SP to sample the complementary signals, that is, the in-phase signal and the reverse-phase signal, and supply them to the CMOS latch cell 222.

The inverter circuit 223 is formed of a first CMOS inverter having a PMOS transistor Qp28 and an NMOS transistor Qn28 connected in series, gates thereof being commonly connected, and a second CMOS inverter having a PMOS transistor Qp29 and an NMOS transistor Qn29 connected in series, gates thereof being commonly connected. The inverter circuit 223 is driven by the power supply voltage VDD which is supplied via the PMOS transistor Qp26.

In the inverter circuit 223, the input ends of the first and second CMOS inverters, i.e., the common gate node of the MOS transistors Qp28 and Qn28 and the common gate node of the MOS transistors Qp29 and Qn29, are connected with the output ends of the first and second CMOS inverters of the CMOS latch cell 222, respectively. The output ends of the first and second CMOS inverters, i.e., the common drain node of the MOS transistors Qp28 and Qn28 and the common drain node of the MOS transistors Qp29 and Qn29, are connected with drains of NMOS transistors Qn30 and Qn31, respectively. The NMOS transistors Qn30 and Qn31 are turned on for a high-level period of the sampling pulse SP level-shifted by the CMOS inverter 221 to transmit the complementary signals latched in the CMOS latch cell 222 to the subsequent second latch unit 23.

The second latch unit 23 is formed of a CMOS latch 231 and a CMOS inverter 232. The CMOS latch 231 has a first CMOS inverter having a PMOS transistor Qp32 and an NMOS transistor Qn32 connected in series between the VDD line and the GND line, gates thereof being commonly connected, and a second CMOS inverter having a PMOS transistor Qp33 and an NMOS transistor Qn33 connected in series between the VDD line and the GND line, gates thereof being commonly connected. The input and output ends of these CMOS inverters are cross-connected.

More specifically, the input end of the first CMOS inverter, i.e., the common gate node of the MOS transistors Qp32 and Qn32, is connected with the output end of the second CMOS inverter, i.e., the common drain node of the MOS transistors Qp33 and Qn33, and the input end of the second CMOS inverter, i.e., the common gate node of the MOS transistors Qp33 and Qn33, is connected with the output end of the first CMOS inverter, i.e., the common drain node of the MOS transistors Qp32 and Qn32. The input ends of the first and second CMOS inverters are connected with the sources of the NMOS transistors Qn30 and Qn31 of the first latch unit 22, respectively.

The CMOS inverter 232 is formed of a PMOS transistor Qp34 and an NMOS transistor Qn34 connected in series between the VDD line and the GND line, gates thereof being commonly connected. The input end of the CMOS inverter 232, i.e., the common gate node of the MOS transistors Qp34 and Qn34, is connected with the output end of the first CMOS inverter of the CMOS latch 231, and the output end of the CMOS inverter 232, i.e., the common drain node of the MOS transistors Qp34 and Qn34, is connected with the circuit output terminal 29.

Figure 4:
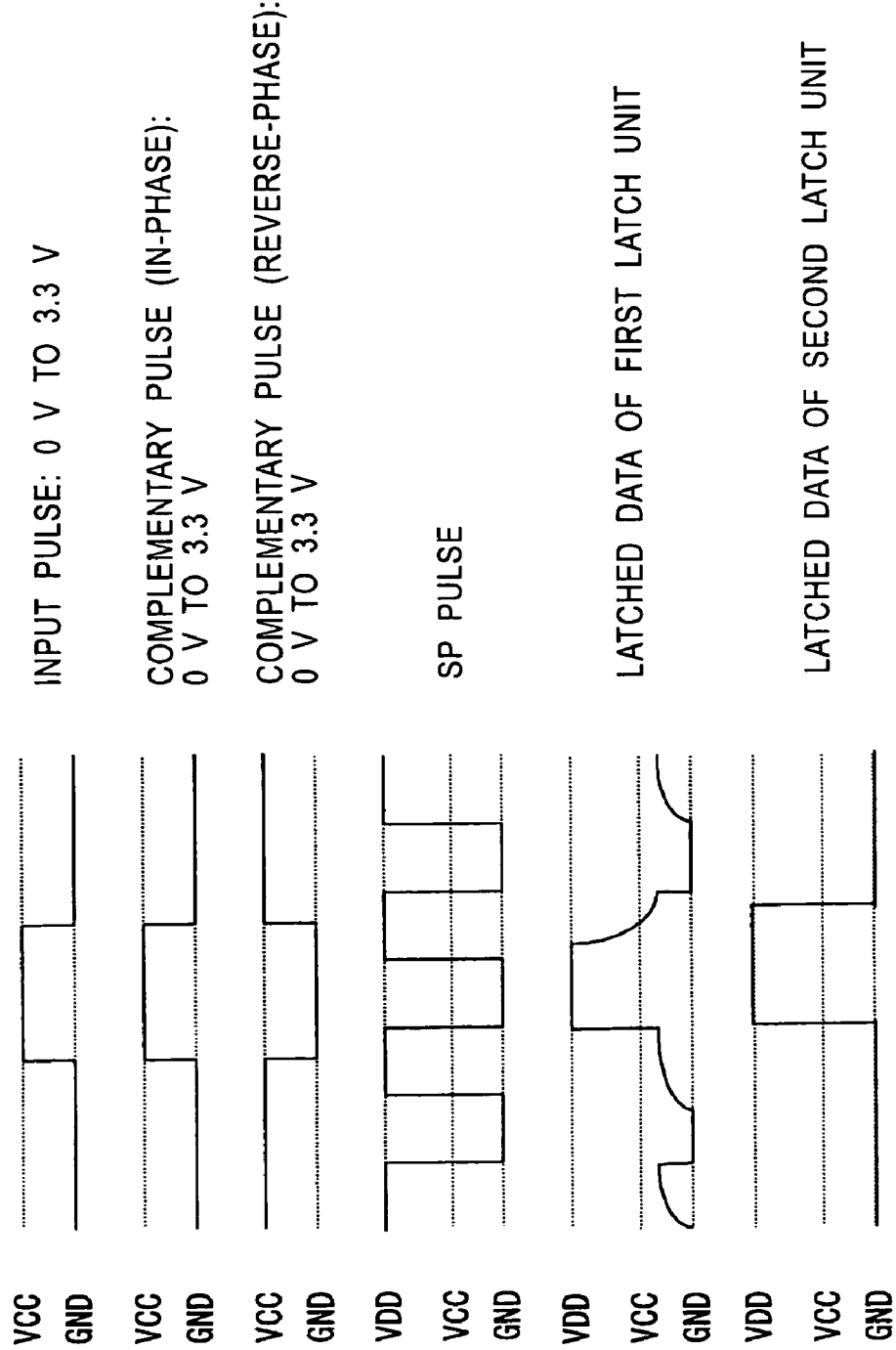
FIG. 4 is a timing chart showing the circuit operation of the level shift circuit according to the second embodiment.

The circuit operation of the level shift circuit according to the second embodiment having the above-described structure is described hereinbelow with reference to the timing chart shown in FIG. 4. In the following description, the input signal IN is a pulse signal, by way of example.

When a single-phase input pulse with 0 to 3.3 V amplitude is input via the circuit input terminal 26, the complementary generator unit 21 generates complementary (in-phase or reverse-phase) pulses of 0 V to 3.3 V from this input pulse. The generated complementary pulses are sampled by turning on the NMOS transistors Qn26 and Qn27 for the high-level period of the sampling pulse SP input via the control terminal 24, and are then input to the CMOS latch cell 222 of the second latch unit 22.

When the sampling pulse SP becomes low, the NMOS transistors Qn26 and Qn27 are turned off to interrupt the input of the complementary pulses to the CMOS latch cell 222. At the same time, the PMOS transistor 26 is turned on to supply the power supply voltage VDD to the CMOS latch cell 222. The first latch unit 22, namely, the CMOS latch cell 222, stores (latches) the data at the time when the sampling pulse SP becomes low.

In the same period, the sampling pulse SP inverted by the CMOS inverter 221 becomes high, and the NMOS transistors Qn30 and Qn31 of the first latch unit 22 are turned on, so that the data latched in the CMOS latch cell 222 is transmitted to the second latch unit 23 and is also written to the CMOS latch cell 231. The written data is still stored in the CMOS latch cell 231 for a period in which the first latch unit 22 latches the next data. The latched data is inverted by the CMOS inverter 232, and is then output as a single-phase output pulse OUT that is in-phase with the input pulse IN from the circuit output terminal 29.

As described above, a level shift circuit formed on an insulating substrate, such as a glass substrate, using transistors with large characteristic variations, for example, TFTs with high thresholds Vth, is provided with the complementary generator unit 21 driven by a first power supply (VCC) having an amplitude voltage equal to the amplitude voltage of a signal input from the outside of the substrate to generate complementary signals from a single-phase input signal IN, thus achieving similar advantages to the first embodiment.

Specifically, it is no longer necessary to input a reverse-phase signal XIN from the outside of the substrate. Thus, no external IC is required for generating the reverse-phase signal XIN based on the input signal IN, and one terminal of the level shift circuit can be eliminated. Moreover, the input signal IN is not input directly from the outside to the first latch unit 22, but is received by the inverters of the complementary generator unit 21 so as to convert the signal into complementary signals, which are then input thereto. This results in no D.C. current flowing in the input terminal 26, and eliminates the danger of flowing overcurrent into an external signal line, which carries the input signal IN, when the power supply is turned on or the like.

In the level shift circuit according to this embodiment, basically, the level shift unit is implemented by a sampling-latch-type latch circuit, which does not cause a D.C. current to flow constantly, unlike the level shift circuit according to the first embodiment, thus reducing the power consumption. The level shift circuit according to this embodiment is therefore suitable for the purpose of low power consumption.

In the foregoing embodiments, each of the complementary generator units 11 and 21 is formed of two cascaded inverters, by way of example. The merit of this structure is that a D.C. current is not caused to flow in the input terminal 117 or 26. However, the complementary generator unit 11 or 21 is not necessarily formed of two inverters as long as it can generate complementary signals from a single-phase input signal, and may be formed of a single inverter in which complementary signals can be obtained from the input side and output side of this inverter.

The level shift circuits according to the above-described first and second embodiments can be used as, for example, level shift circuits for use in an integrated-driving-circuit display apparatus having peripheral driving circuits integrally formed on the same transparent insulating substrate on which a display unit having a matrix of pixels is formed for level-shifting a low-voltage-amplitude signal input from the outside of the substrate to a high-voltage-amplitude signal.

APPLICATION EXAMPLES

Figure 5:
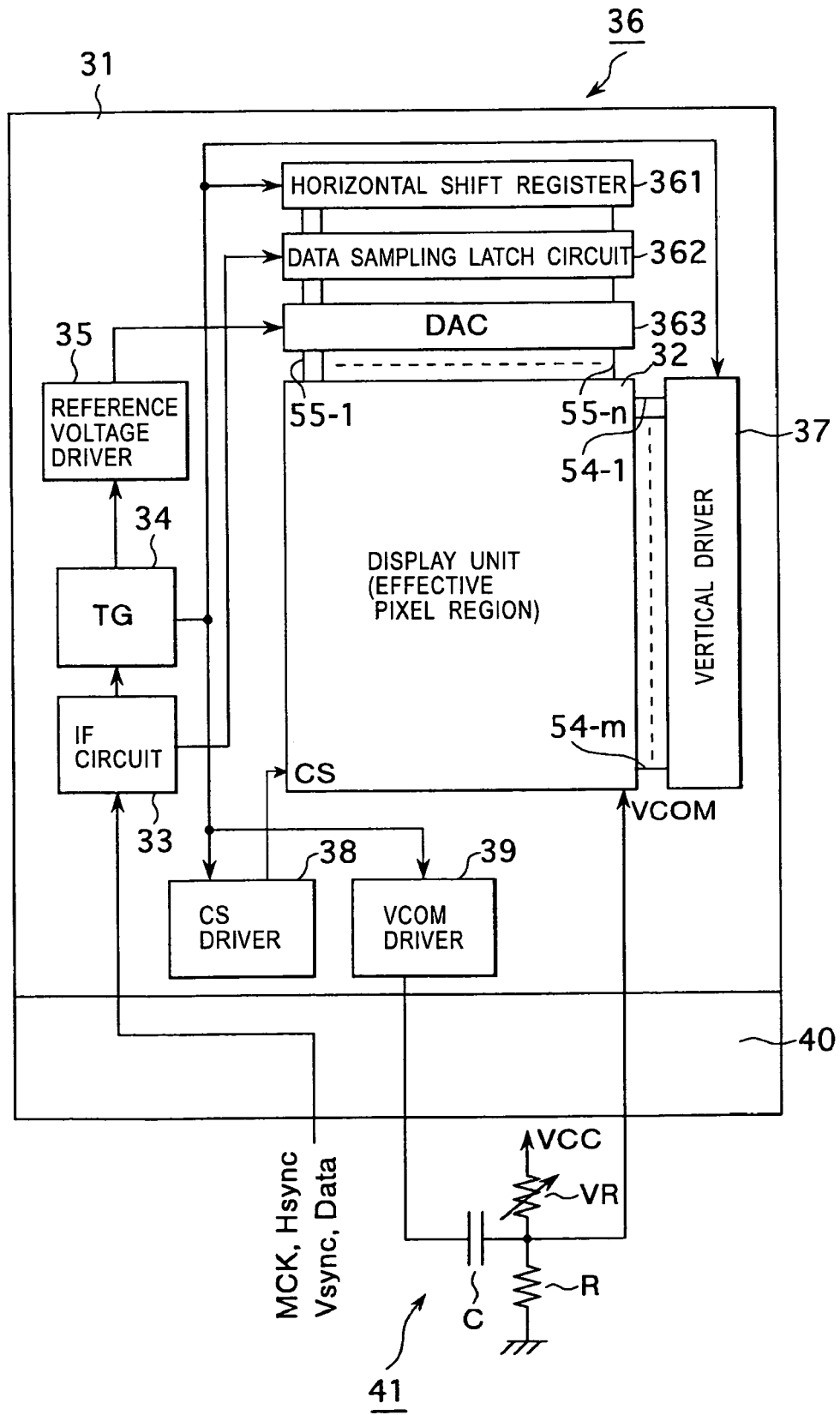
FIG. 5 is a block diagram showing an example structure of a liquid crystal display apparatus according to the present invention.

FIG. 5 is a block diagram showing an example structure of a display apparatus according to the present invention, for example, a liquid crystal display apparatus. In FIG. 5, a display unit (pixel unit) 32 having a matrix of pixels is formed on a transparent insulating substrate, for example, a glass substrate 31. The glass substrate 31 faces another glass substrate with a predetermined spacing therebetween, and a liquid crystal material is disposed between both substrates, thereby forming a display panel (an LCD panel).

Figure 6:
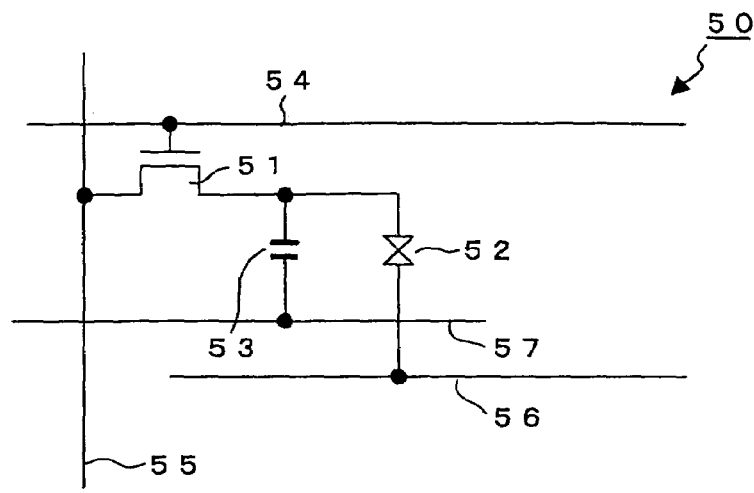
FIG. 6 is a circuit diagram showing an example of the pixel structure.

An example of the pixel structure of the display unit 32 is shown in FIG. 6. Each of the pixels 50 arranged into a matrix includes a TFT (Thin Film Transistor) 51 serving as a pixel transistor, a liquid crystal cell 52 having a pixel electrode connected with a drain electrode of the TFT 51, and a storage capacitor 53 having one electrode connected with the drain electrode of the TFT 51. The liquid crystal cell 52 means the liquid crystal capacitance generated between the pixel electrode and a counter electrode thereof.

In this pixel structure, the TFT 51 has a gate electrode connected with a gate line (scanning line) 54, and a source electrode connected with a data line (signal line) 55. The counter electrode of the liquid crystal cell 52 is connected with a VCOM line 56, as is common to the pixels. A common voltage VCOM (VCOM potential) is applied to the counter electrode of the liquid crystal cell 52 via the VCOM line 56, as is common to the pixels. The other electrode (the terminal on the counter electrode side) of the storage capacitor 53 is connected with a CS line 57, as is common to the pixels.

In a case where 1H (H indicates a horizontal period) inversion driving or 1F (F indicates a field period) inversion driving is performed, a display signal to be written to each pixel is polarity-inverted based on the VCOM potential. In a case where VCOM inversion driving in which the polarity of the VCOM potential is inverted every 1H or 1F is performed in combination with 1H inversion driving or 1F inversion driving, the polarity of the CS potential applied to the CS line 57 is also inverted in synchronization with the VCOM potential. However, the liquid crystal display apparatus according to this embodiment is not limited to VCOM inversion driving.

Referring again to FIG. 5, formed on the same glass substrate 31 on which the display unit 32 is formed are, for example, an interface (IF) circuit 33, a timing generator (TG) 34, and a reference voltage driver 35 on the left of the display unit 32; a horizontal driver 36 on the upper side of the display unit 32; a vertical driver 37 on the right of the display unit 32; and a CS driver 38 and a VCOM driver 39 on the lower side of the display unit 32. These peripheral driving circuits and the pixel transistors of the display unit 32 are made of low-temperature polysilicon or CG (Continuous Grain) silicon.

In the liquid crystal display apparatus having the above-described structure, a low-voltage-amplitude (for example, 3.3-volt-amplitude) master clock MCK, horizontal synchronous pulse Hsync, vertical synchronous pulse Vsync, and R (red), G (green), and B (blue) parallel-input display data Data are externally input to the glass substrate 31 via a flexible cable (substrate) 40, and are level-shifted (level-converted) by the interface circuit 33 to high-voltage-amplitude (for example, 6.5-volt) signals.

The level-shifted master clock MCK, horizontal synchronous pulse Hsync, and vertical synchronous pulse Vsync are supplied to the timing generator 34. The timing generator 34 generates various timing pulses necessary for driving the reference voltage driver 35, the horizontal driver 36, the vertical driver 37, the CS driver 38, and the VCOM driver 39 based on the master clock MCK, the horizontal synchronous pulse Hsync, and the vertical synchronous pulse Vsync. The level-shifted display data Data is supplied to the horizontal driver 36.

The horizontal driver 36 includes, for example, a horizontal shift register 361, a data sampling latch circuit 362, and a DA (digital-to-analog) converter circuit (DAC) 363. The horizontal shift register 361 starts a shift operation in response to a horizontal start pulse HST supplied from the timing generator 34, and generates sampling pulses, which is sequentially transferred in one horizontal period in synchronization with a horizontal clock pulse HCK also supplied from the timing generator 34.

In synchronization with the sampling pulses generated by the horizontal shift register 361, the data sampling latch circuit 362 sequentially samples and latches the display data Data output from the interface circuit 33 in one horizontal period. The latched digital data corresponding to one line is further transferred to a line memory (not shown) in a horizontal blanking period. The digital data corresponding to one line is converted by the DA converter circuit 363 into an analog display signal.

The DA converter circuit 363 is, for example, a reference-voltage-selection-type DA converter circuit for selecting a reference voltage corresponding to the digital data from reference voltages corresponding to the number of gray-scales supplied from the reference voltage driver 35 and for outputting the selected voltage as an analog display signal. An analog display signal Sig corresponding to one line output from the DA converter circuit 363 is output to data lines 55-1 to 55-n corresponding to n horizontal pixels of the display unit 32.

The vertical driver 37 is formed of a vertical shift register and a gate buffer. In the vertical driver 37, the vertical shift register starts a shift operation in response to a vertical start pulse VST supplied from the timing generator 34, and generates scanning pulses to be sequentially transferred in one vertical period in synchronization with a vertical clock pulse VCK also supplied from the timing generator 34. The generated scanning pulses are sequentially output via the gate buffer to gate lines 54-1 to 54-m corresponding to m vertical pixels of the display unit 32.

When the scanning pulses are sequentially output to the gate lines 54-1 to 54-m by vertical scanning of the vertical driver 37, the pixels of the display unit 32 are selected row-by-row (line-by-line) in turn. The analog display signal Sig corresponding to one line output from the DA converter circuit 363 is written at the same time to the selected pixels corresponding to one line via the data lines 55-1 to 55-n. This line-by-line writing operation is repeated, thus allowing an image of one screen to be displayed.

The CS driver 38 generates the above-described CS potential, and applies it to the other electrode of the storage capacitor 53 via the CS line 57 shown in FIG. 6, as is common to the pixels. Given that the amplitude of the display signals is, for example, 0 to 3.3 V, the CS potential is inverted alternately between 0 V (ground level) as the minimum level and 3.3 V as the maximum level in a case where VCOM inversion driving is performed.

The VCOM driver 39 generates the above-described VCOM potential. The VCOM potential output from the VCOM driver 39 is once output to the outside of the glass substrate 31 via the flexible cable 40. The VCOM potential output to the outside passes through a VCOM adjusting circuit 41, and is again input to the glass substrate 31 via the flexible cable 40. The input VCOM potential is applied to the counter electrode of the liquid crystal cell 52 via the VCOM line 56 shown in FIG. 6, as is common to the pixels.

As used herein, the VCOM potential is an A.C. voltage having substantially the same amplitude as the CS potential. In practical use, however, a voltage drop occurs in the TFT 51 shown in FIG. 6 due to parasitic capacitance or the like when the signal is written to the pixel electrode of the liquid crystal cell 52 from the gate line 54 via the TFT 51, and the VCOM potential must be an A.C. voltage which is DC shifted by the amount of voltage drop. The VCOM potential is DC shifted by the VCOM adjusting circuit 41.

The VCOM adjusting circuit 41 is formed of a capacitor C to which the VCOM potential is input, a variable resistor VR connected between the output end of the capacitor C and an external power supply VCC, and a resistor R connected between the output end of the capacitor C and a ground. The VCOM adjusting circuit 41 adjusts the DC level of the VCOM potential applied to the counter electrode of the liquid crystal cell 52, that is, a DC offset is added to the VCOM potential.

In the liquid crystal display apparatus having the above-described structure, the horizontal driver 36 and the vertical driver 37, as well as peripheral driving circuits, such as the interface circuit 33, the timing generator 34, the reference voltage driver 35, the CS driver 38, and the VCOM driver 39, are integrally formed on the same panel (the glass substrate 31) on which the display unit 32 is formed. Therefore, a display panel with all the driving circuits integrated can be constructed without any external substrate, IC, or transistor circuit, thus reducing the size and cost of the overall system.

In the integrated-driving-circuit liquid crystal display apparatus, level shift circuits forming the interface circuit 33 are implemented by the level shift circuits according to the first and second embodiments. As described above, the master clock MCK, the horizontal synchronous pulse Hsync, the vertical synchronous pulse Vsync, and the R (red), G (green), and B (blue) parallel-input display data Data are input from the outside of the substrate to the interface circuit 33. Where one color is represented by, for example, 6 bits, the display data Data is 18-bit data (=6 bits×3).

Figure 7:
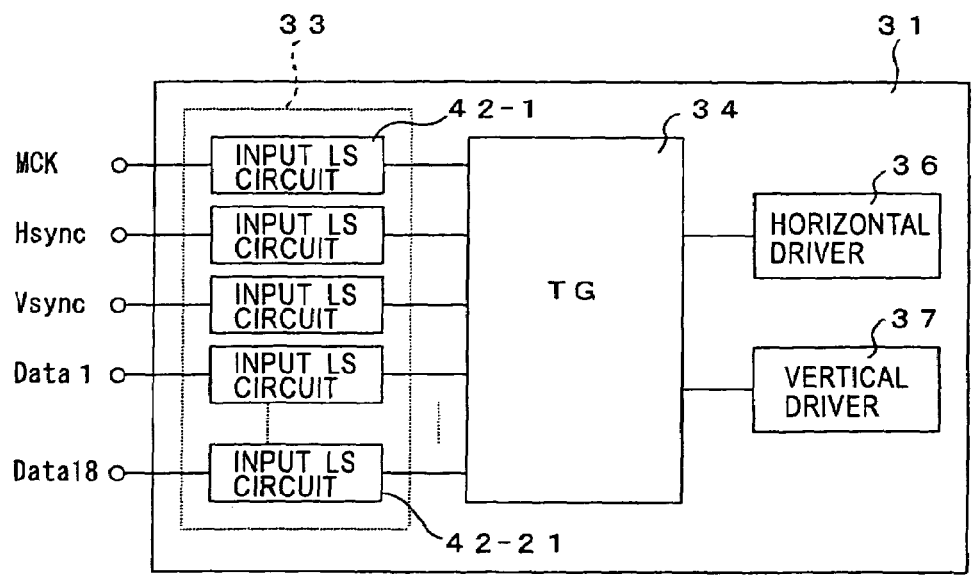
FIG. 7 is a block diagram showing a specific example of the internal structure of an interface circuit.

FIG. 7 shows a specific example of the internal structure of the interface circuit 33. The interface circuit 33 in this example includes 21 input level shift (LS) circuits 42-1 to 42-21 corresponding to the externally input master clock MCK, horizontal synchronous pulse Hsync, vertical synchronous pulse Vsync, and 18-bit display data Data. The input level shift circuits 42-1 to 42-21 are implemented by the level shift circuits according to the first and second embodiments. Since the level shift circuits according to the first and second embodiments support a single-phase input signal, a single-phase signal can be input to all of the input level shift circuits 42-1 to 42-21, thus greatly reducing the number of input terminals of the display panel.

The master clock MCK is a much-higher-frequency signal than any other signal of the low-voltage-amplitude (in this example, 0 V to 3.3 V) signals input from the outside of the substrate. It is preferable that the input level shift circuit 42-1 which level-shifts the master clock MCK be implemented by the level shift circuit according to the first embodiment, that is, a source-input-type level shift circuit having a high operation speed. It is preferable that each of the input level shift circuits 42-2 to 42-21 which level-shift the remaining signals be implemented by the level shift circuit according to the second embodiment, that is, a sampling-latch-type level shift circuit with low power consumption.

Accordingly, sampling-latch-type level shift circuits with low power consumption are used for the signals other than the master clock MCK, i.e., the horizontal synchronous pulse Hsync, the vertical synchronous pulse Vsync, and the 18-bit display data Data. Therefore, the power consumption of the overall liquid crystal display apparatus can be reduced.

In the application example, a liquid crystal display apparatus using liquid crystal cells as display elements is used, by way of example. However, the present invention is not limited to this application example, and may be applicable to any display apparatus having a level shift circuit formed on the same substrate on which a display unit is formed, such as an EL (electroluminescence) display apparatus using EL elements as display elements.

A display apparatus, such as the liquid crystal display apparatus in the above-described application example, is suitably used as a screen display unit of small and light portable terminals, such as cellular phones and PDAs (Personal Digital Assistants).

Figure 8:
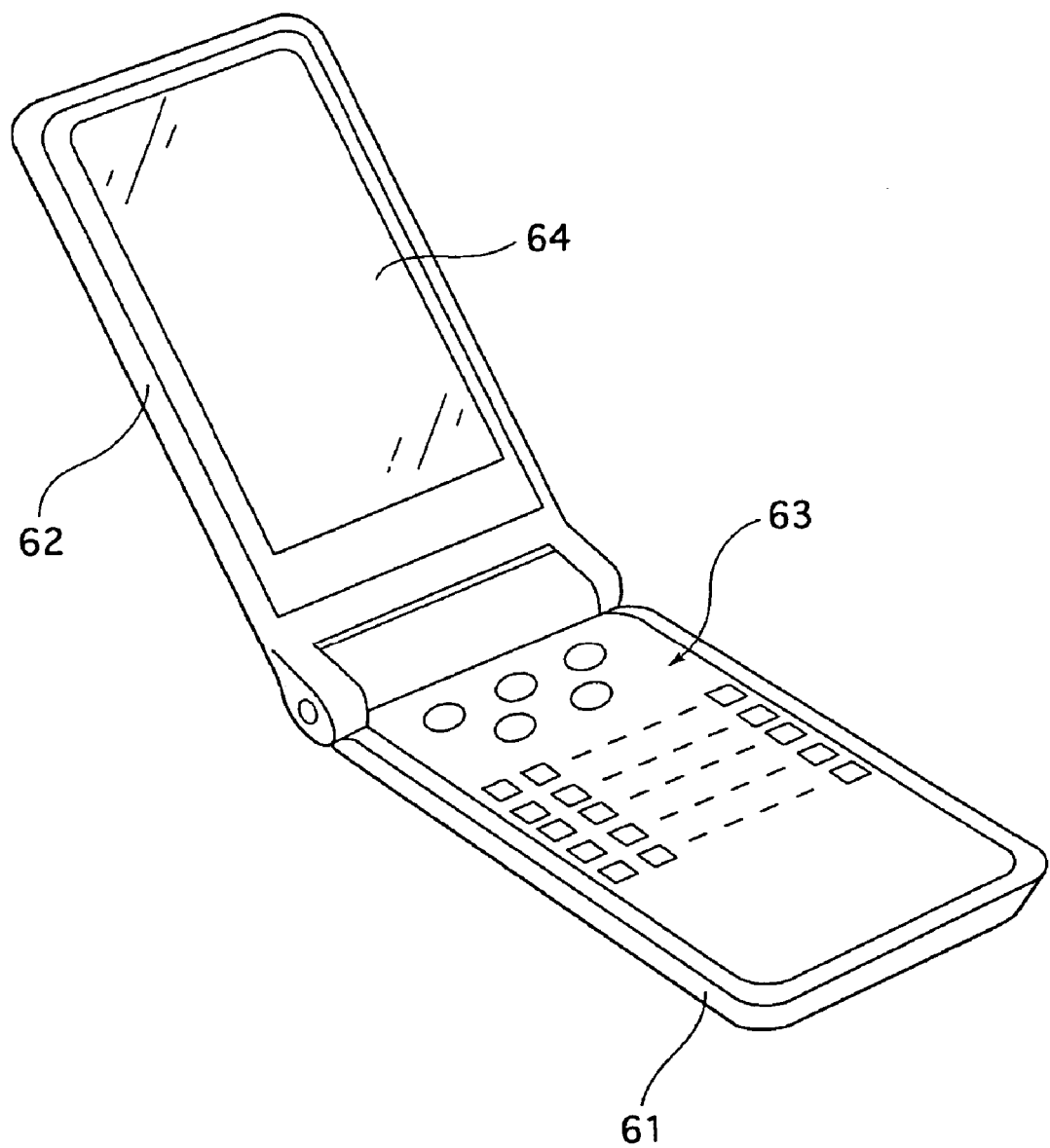
FIG. 8 is an external view schematically showing the structure of a PDA according to the present invention.
Figure 9:
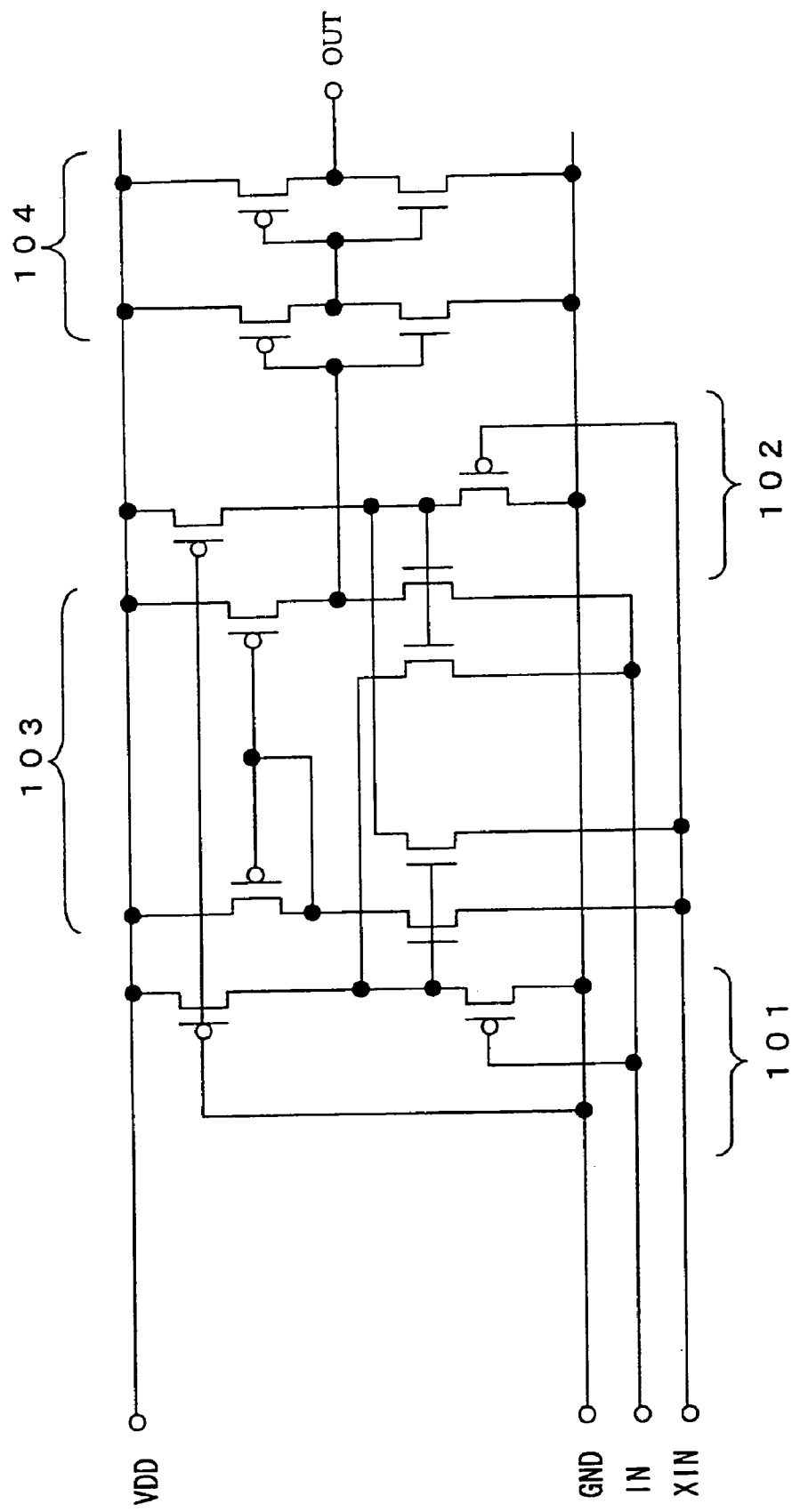
FIG. 9 is a circuit diagram showing an example structure of a level shift circuit of the related art.

FIG. 8 is an external view schematically showing the structure of a portable terminal according to the present invention, for example, a PDA.

The PDA in this example has, for example, a folded structure in which a cover 62 is openable and closable with respect to a main body 61. An operation unit 63 having various keys, such as a keyboard, is disposed on the top surface of the main body 61. The cover 62 includes a screen display unit 64. The screen display unit 64 is implemented by the liquid crystal display apparatus having the level shift circuits according to the first and second embodiments formed on the same substrate on which the display unit is formed.

As described above, since the liquid crystal display apparatus using the level shift circuits according to the foregoing embodiments support a single-phase signal input from the outside of the substrate, no external circuit is required for generating a reverse-phase signal. Moreover, the number of input terminals of the display panel can be greatly reduced. The liquid crystal display apparatus is used as the screen display unit 64, thus making it possible to achieve the PDA with a simple overall structure and less wiring, which contributes to a reduction in size and cost.

Although an application to a PDA has been described, by way of example, the present invention is not limited to this application example. The liquid crystal display apparatus according to the present invention may be suitable for any small and light portable terminal, such as a cellular phone, in particular.

INDUSTRIAL APPLICABILITY

According to the present invention, therefore, a level shift circuit formed on an insulating substrate using transistors with large characteristic variations is provided with a complementary generator unit driven by a first power supply having an amplitude voltage equal to the amplitude voltage of a signal input from the outside of the substrate to generate complementary signals from a single-phase input signal. It is therefore no longer necessary to externally input a reverse-phase signal. Thus, no external IC is required for generating a reverse-phase signal of the single-phase signal, and one terminal of the level shift circuit can be eliminated. Moreover, the input signal is not input directly from the outside, but is received by the complementary generator unit so as to convert the signal into complementary signals, which are then input. This results in no D.C. current flowing in a signal input terminal, and eliminates the danger of flowing overcurrent into an external signal line, which carries the input signal, when the power supply is turned on or the like.

The invention claimed is:

1. A level shift circuit formed on an insulating substrate for level shifting an externally input signal input from outside the substrate, comprising:
   a complementary generator unit formed on said insulating substrate and driven by a first power supply having an amplitude voltage equal to an amplitude voltage of the externally input signal input from outside the insulating substrate for generating a complementary signal from the externally input signal; and
   a level shift unit formed on said insulating substrate and driven by a second power supply having a higher voltage than the first power supply for shifting the level of the complementary signal, and
   wherein the level shift unit includes a current mirror circuit, and has a source-input circuit structure in which the complementary signal is input to a source of an input-stage transistor of the current mirror circuit.

2. A display apparatus comprising:
   a display unit having a matrix of pixels formed on a transparent insulating substrate; and
   a level shift circuit formed on the transparent insulating substrate together with the display unit for shifting the level of an input signal input from outside the substrate so as to drive the display unit,
   wherein the level shift Circuit includes:
   a complementary generator unit driven by a first power supply having an amplitude voltage equal to an arnpi-tude voltage of the signal input from the outside of the substrate for generating a complementary signal from a the input signal; and
   a level shift unit driven by a second power supply having a higher voltage than the first power supply for shifting the level of the complementary signal, and
   wherein the level shift unit includes a current mirror circuit and has a source-input circuit structure in which the complementary sienal is input to a source of an input-stage transistor of the current mirror circuit.

* * * * *